United States Patent
Neyret et al.

(10) Patent No.: US 7,049,250 B2
(45) Date of Patent: *May 23, 2006

(54) HEAT TREATMENT FOR EDGES OF MULTILAYER SEMICONDUCTOR WAFERS

(75) Inventors: Eric Neyret, Sassenage (FR); Christophe Maleville, La Terrasse (FR)

(73) Assignee: S.O.I.Tec Silicon on Insulator Technologies S.A., Bernin (FR)

( * ) Notice: Subject to any disclaimer, the term of this patent is extended or adjusted under 35 U.S.C. 154(b) by 0 days.

This patent is subject to a terminal disclaimer.

(21) Appl. No.: 11/008,928

(22) Filed: Dec. 13, 2004

(65) Prior Publication Data

US 2005/0094990 A1    May 5, 2005

Related U.S. Application Data

(62) Division of application No. 10/700,885, filed on Nov. 3, 2003.

(30) Foreign Application Priority Data

Nov. 5, 2002 (FR) .................................. 02 13810
Jan. 13, 2003 (FR) .................................. 03 00286

(51) Int. Cl.
H01L 21/324 (2006.01)
H01L 21/477 (2006.01)
H01L 21/42 (2006.01)

(52) U.S. Cl. ................................................ 438/795
(58) Field of Classification Search ............... 438/795
See application file for complete search history.

(56) References Cited

U.S. PATENT DOCUMENTS

| | | | |
|---|---|---|---|
| 4,958,061 A | 9/1990 | Wakabayashi et al. | 219/411 |
| 5,011,794 A | 4/1991 | Grim et al. | 437/247 |
| 5,937,142 A | 8/1999 | Moslehi et al. | 392/416 |
| 6,051,512 A | 4/2000 | Sommer et al. | 438/795 |
| 6,184,498 B1 | 2/2001 | Kiyama | 219/390 |
| 6,235,543 B1 | 5/2001 | Kiyama | 438/5 |
| 6,570,134 B1 | 5/2003 | Suzuki et al. | 219/390 |
| 6,717,112 B1 | 4/2004 | Probst | 219/390 |
| 6,853,802 B1 * | 2/2005 | Neyret et al. | 392/416 |
| 2001/0036219 A1 | 11/2001 | Camm et al. | 374/112 |
| 2003/0068903 A1 | 4/2003 | Suzuki et al. | 438/799 |

FOREIGN PATENT DOCUMENTS

| | | |
|---|---|---|
| EP | 0 399 662 A2 | 11/1990 |
| EP | 1 197 989 A2 | 4/2002 |
| WO | WO 01/69656 A2 | 9/2001 |

OTHER PUBLICATIONS

Timans et al., "Handbook of Semiconductor Manufacturing Technology", p. 224 (2000).

* cited by examiner

Primary Examiner—Asok Kumar Sarkar
(74) Attorney, Agent, or Firm—Winston & Strawn LLP

(57) ABSTRACT

A method for heat treating a multilayer semiconductor wafer having a central region and a peripheral edge each having a surface. The method includes selecting thickness values for the layers of the wafer to provide substantially equivalent heat absorption coefficients both in the central region and the edge of the wafer. This results in a substantially equivalent temperature being attained over the surface of the central region and the peripheral edge during thermal treatment. In turn, that prevents the appearance of slip lines on those surfaces while also preventing deformation of the wafer due to the thermal treatment. To achieve the desired thickness, layers or portions of layers can be selectively added or otherwise provided upon the central region or peripheral edge of the wafer, or on both, to modify the heat absorption coefficient of the wafer.

14 Claims, 2 Drawing Sheets

Total hemispherical heat absorption coefficient

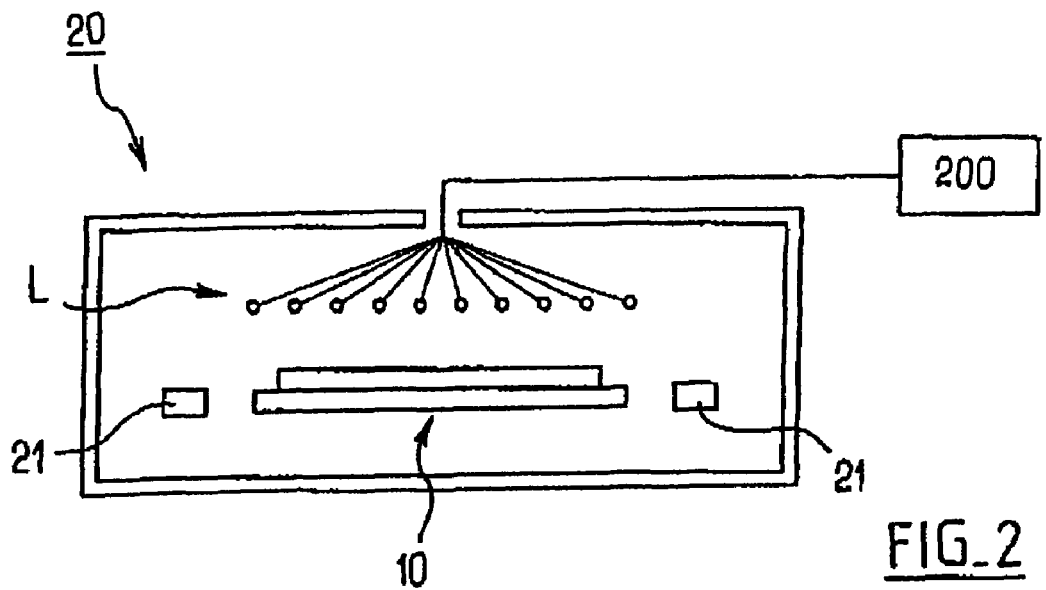
FIG_2
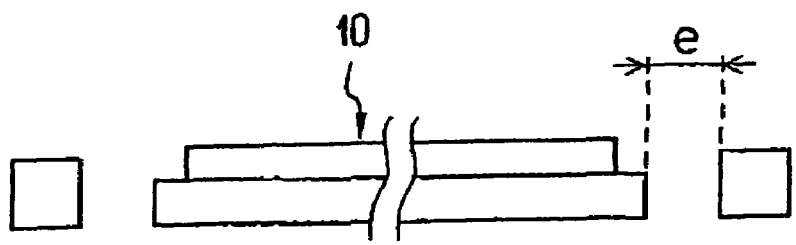
FIG_3a
PRIOR ART
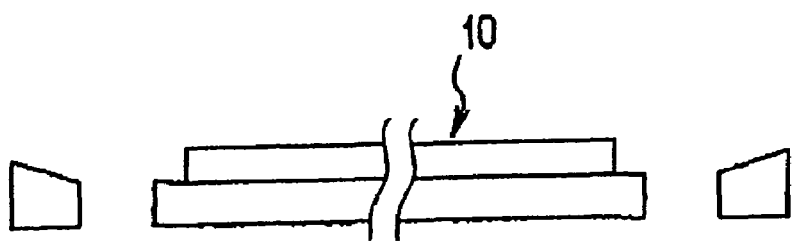
FIG_3b
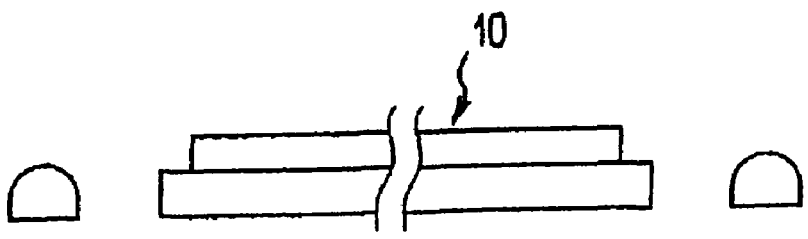
FIG_3c

HEAT TREATMENT FOR EDGES OF MULTILAYER SEMICONDUCTOR WAFERS

CROSS-REFERENCE TO RELATED APPLICATIONS

This application is a division of application Ser. No. 10/700,885 filed Nov. 3, 2003, now U.S. Pat. No. 6,853,802 the entire content of which is expressly incorporated herein by reference thereto.

BACKGROUND ART

The present invention generally relates to a method of applying heat treatment to a multilayer semiconductor wafer having a peripheral edge. In particular, selected portions of the peripheral edge are thermally treated to compensate for local differences in heat absorption. This establishes a substantially equivalent temperature over both the surface of the central region and the surface of the peripheral edge to prevent the appearance of slip lines on those surfaces. An application of the invention relates to silicon on insulator (SOI) type wafers that include a working top layer of silicon, an insulating intermediate layer which may be an oxide layer, and a bottom support layer.

The term "multilayer wafer with an edge" is used herein to mean a wafer of semiconductor material which includes the following two characteristics. First, the wafer is a "multilayer" wafer, which means that it is made of an assembly of at least two layers. Second, the multilayer wafer has an "edge", meaning that it has a peripheral edge (it being understood that the type of wafers to which the invention relates are generally circular in shape) presenting a step in thickness. Typically, at least one upper layer of the wafer is not present in the peripheral edge, and thus only the lower layer(s) is/are present.

Methods suited for obtaining SOI type wafers include transfer methods which create and utilize a zone of weakness. Under such circumstances, a working layer of silicon is obtained from a silicon substrate in which the zone of weakness has been created. For example, a SMART-CUT® type method may be used.

When a SOI wafer is detached from its substrate along the zone of weakness, only the central portion (which, seen from above, is the largest portion of the wafer) of the silicon layer is actually detached from the substrate. Detachment does not actually occur in the peripheral region of the wafer. Thus, the resulting SOI wafers include an "edge" in the form of a downward step. FIG. 1 illustrates such a step in a highly diagrammatic and simplified manner. In particular, FIG. 1 shows a SOI wafer 10 after it has been detached from a substrate. The wafer includes a support layer 100, an insulating layer 101, and a working layer 102 of silicon. The layers 101 and 102 define a peripheral edge 1020 that is a few millimeters wide. Such wafers are generally subjected to heat treatments, which may be for the purpose of modifying the composition of one or more layers of the wafer, or for stabilizing a bonding interface between two layers, or for curing structural defects, and/or for improving the surface state of the wafer, for example. Such heat treatments (or annealing operations) can be implemented in a wide variety of manners. Thus, some annealing operations are performed in temperature ranges that are considered to be "low" for applications of the invention. For purposes of the present specification, "low" temperatures are defined by convention as being less than a value of about 500° C. to 600° C. This definition is given solely for the purposes of the present description, and it should be understood that it does not necessarily correspond to a definition that is universally accepted in the field of the invention. Annealing may also be undertaken at "high" temperatures, which means at values greater than about 500° C.–600° C.

One particular mode of high temperature annealing is known as rapid thermal processing (RTP). In RTP mode, the processing temperature is generally very high (typically about 950° C. or higher), and the annealing time is kept down to a duration of the order of a few minutes. It is known to subject SOI type wafers to rapid thermal annealing (RTA) where the temperature reaches values of about 1100° C. to 1250° C., the total duration of annealing being of the order of only a few tens of seconds. The effect of such annealing is to smooth the surface of a wafer, and it is common to find that the roughness specifications for SOI type wafers must not exceed 5 angstroms (Å) in root mean square (rms) value.

Wafers (in particular SOI wafers) can also be subjected to other types of RTP annealing, for example annealing of the rapid thermal oxidation (RTO) type. Such annealing, which is performed under an oxidizing atmosphere, oxidizes the surface of the wafer. Multilayer semiconductor wafers which have an edge may thus be subjected to various types of annealing techniques.

It has been observed that drawbacks are associated with annealing operations performed on such wafers. More precisely, RTP type annealing operations (including RTA, RTO, and the like.) generate defects known as "slip lines" in wafers. Such slip lines are generated in particular by temperature non-uniformities in three dimensions within an annealing furnace (that is, the temperature is not strictly identical at all points). Slip lines develop in the wafer under the effect of the above-mentioned very high levels of thermal stress. It has also been observed that such slip lines are generally initiated in the peripheral region of the wafer. This phenomenon of slip lines at the periphery of the wafer is particularly severe for multilayer wafers having an edge.

RTP type annealing thus tends to generate slip lines, and this drawback is in particular severe for multilayer semiconductor wafers having an edge. Such heat treatments subject the wafer to very high levels of thermal stress because of the very rapid temperature rises they induce.

It should be understood that this major drawback is more severe when annealing is performed by radiating heat from one or more heat sources. A typical illustration is RTP annealing using infrared lamps that emit heat radiation, with the wafer being placed facing the lamps. The generation of slip lines is less severe when annealing is performed by thermal conduction (as happens in an annealing furnace filled with a heat-conducting gas that surrounds the wafer). For annealing that does not involve RTP mode (i.e. annealing performed at low temperature), this drawback is less severe.

However, wafer deformation can still be observed even with low-temperature annealing. Such deformation is typically associated with wafers bending or twisting to some extent, as can be observed, for example by variation in the warp of the wafer. Warp represents the maximum deformation of the wafer relative to an "ideal" wafer, which is a wafer that is absolutely flat. Such warp can also be observed when annealing is performed in RTP mode. Therefore, there are several drawbacks when annealing is performed on multilayer semiconductor wafers that include an edge.

Certain documents suggest solutions for locally heating a wafer, for example, by selectively powering infrared lamps positioned to face different regions of the wafer. However, the documents do not seek to solve the particular problem mentioned above. Such documents are generally limited to treating simple single-layer wafers without edges, where the specific problem of generating slip-lines on multilayer wafers having an edge does not arise.

Other documents suggest solutions for controlling heating at the periphery of a wafer, by using a thermal continuity ring. However the teaching of those documents is limited to setting up a thermal continuity ring in order to avoid edge effects which do not correspond to the specific problem mentioned above.

Examples of documents relating to the above-mentioned prior art techniques include the following. International Application No. WO 01/69656 discloses a ring which acts in a conventional manner to absorb heat and to return it to the wafer it surrounds, in particular without in any way adapting the ring or its disposition in order to address the specific problem of generating slip lines. Published U.S. Application No. 2001/036219, and U.S. Pat. No. 5,937,142 propose locally heating a wafer which is not a multilayer wafer. U.S. Pat. Nos. 6,235,543 and 6,184,498 propose systems that enable conditions under which defects appear in a wafer to be characterized, wherein the wafer is not a multilayer wafer, and for the purpose of subsequently modifying the heating treatment as a function of those conditions under which defects appear. Lastly, U.S. Pat. Nos. 5,011,794, 6,570,134, 4,958,061, and 6,051,512 describe thermal continuity rings and ways of implementing them.

None of these documents concerns the problem of preventing the appearance of defects such as slip lines that are generated due to a difference of heat-absorption coefficients at the edge of a multilayer semiconductor wafer. Furthermore, none of those documents even mentions problems associated specifically with multilayer wafers.

SUMMARY OF THE INVENTION

Presented is a method for heat treating a multilayer semiconductor wafer having a central region and a peripheral edge each having a surface. The method includes selecting thickness values for the layers of the wafer to provide substantially equivalent heat absorption coefficients both in the central region and the edge of the wafer, so that a substantially equivalent temperature is attained over the surface of the central region and the peripheral edge during thermal treatment, to thus prevent the appearance of slip lines on those surfaces while also preventing deformation of the wafer due to the thermal treatment. To achieve the desired thickness, layers or portions of layers can be selectively added or otherwise provided upon the central region or peripheral edge of the wafer, or on both, to modify the heat absorption coefficient of the wafer.

In an advantageous embodiment, the method includes heat treating by utilizing a rapid thermal processing treatment. The rapid thermal processing treatment may be a smoothing annealing treatment, or may be an oxidation annealing treatment. The selection of portions of the peripheral edge to thermally treat may be based on respective heat absorption coefficients of the central region and peripheral edge. In addition, the heat absorption coefficients may be determined based either on the nature of the materials including the layers of the wafer or on the respective thickness values of the layers.

In another embodiment, the method includes selectively controlling a power supply to a plurality of infrared lamps that are directed towards the peripheral edge to thermally treat selected portions of the peripheral edge. In a preferred embodiment according to the invention, the wafer is a silicon-on-insulator wafer and a reduced thermal treatment is conducted at the selected peripheral edge portions as compared to thermal treatment of a reference wafer that does not include an edge.

In yet another advantageous embodiment according to the invention, the multilayer semiconductor wafer is placed within a thermal continuity structure. The dimensions of the thermal continuity structure may be selected to control the thermal treatment of the wafer. In the case where the wafer is a silicon-on-insulator wafer, then the thickness of the thermal continuity structure is less than the thickness of a thermal continuity structure used to thermally treat a reference wafer that does not include an edge. Advantageously, the spacing between the multilayer semiconductor wafer and the thermal continuity structure may be selected to achieve a particular thermal treatment. In the case of a silicon-on-insulator wafer, the space between the wafer and the thermal continuity structure is larger than the space between a thermal continuity structure and a reference wafer that does not include an edge. Furthermore, the shape of the thermal continuity structure could be chosen so that it thermally treats selected portions of the wafer. When the wafer is a silicon-on-insulator wafer then the shape of the thermal continuity structure may include a downwardly facing border that reflects heat towards the edge of the wafer.

In another preferred embodiment, a multilayer semiconductor wafer is provided that has a central region and a peripheral edge with substantially equivalent thermal absorption coefficients. In this case, the substantially equivalent thermal absorption coefficients may be based on the nature of the materials in the layers of the wafer in the central region and in the peripheral edge, and may be based on the respective thickness values of the layers.

In another advantageous aspect of the invention, a thermal continuity structure has dimensions adapted to contribute to establishing an edge temperature of a multilayer semiconductor wafer that is substantially equivalent to a central surface region temperature of the wafer, wherein heat absorption characteristics of the edge are different than heat absorption characteristics of the central surface region. In this case, the thermal continuity structure may be shaped to contribute to establishing an edge temperature that is substantially equivalent to the temperature of the central surface region. In addition, the thermal continuity structure may include a downwardly facing border that is positioned to reflect heat towards the edge of the wafer.

BRIEF DESCRIPTION OF THE DRAWINGS

Other aspects, purposes and advantages of the invention will become clear after reading the following detailed description with reference to the attached drawings, in which:

FIG. 2 is a simplified diagram of an installation of the type that could be used for annealing a multilayer semiconductor structure in accordance with the invention;

FIG. 3a illustrates a conventional thermal continuity structure for use in thermal annealing of a wafer;

FIG. 3b illustrates an implementation of a thermal continuity structure according to the invention;

FIG. 3c illustrates another implementation of a thermal continuity structure according to the invention.

DETAILED DESCRIPTION OF THE PREFERRED EMBODIMENTS

Figure 1:
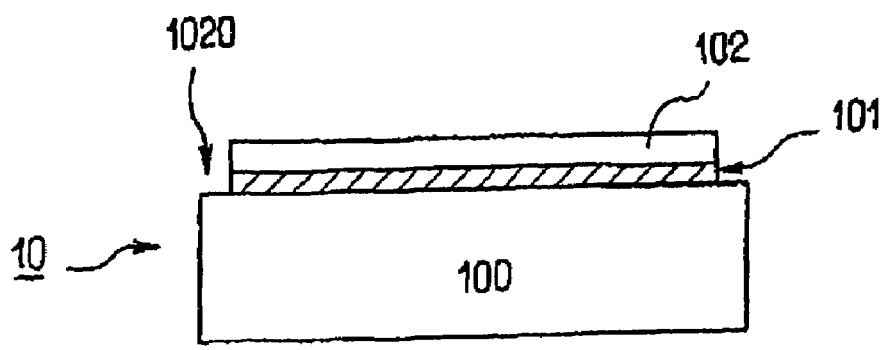
FIG. 1 illustrates a multilayer semiconductor wafer having an edge after it has been detached from a substrate.

With reference initially to FIG. 2, an annealing installation 20 is shown for performing annealing process on a wafer 10 that includes an edge. This installation is suitable for performing RTP type annealing, which may be annealing for smoothing purposes. This type of installation has been selected to illustrate the invention since the drawbacks generated by such annealing (slip lines, and other drawbacks) are particularly severe.

A particularly advantageous application of the invention thus concerns that use of RTP type annealing, such as RTO annealing, or RTA type finishing annealing for smoothing the surface of the wafer. Nevertheless, the present invention is not limited to this type of annealing, but applies to all of the modes of annealing.

The installation 20 can thus be used to perform high-temperature annealing which is not RTP mode annealing, and could be used for low-temperature annealing. In addition, in RTP type annealing (which this installation is also suitable for performing), some of the drawbacks mentioned in the background section (in particular warp) can appear during the rise in temperature which occurs before the high temperature is reached.

In FIG. 2, as well as in FIGS. 3a to 3c, the wafer 10 is shown with only two visible layers. Nevertheless, the wafer may be any type of multilayer wafer, as mentioned above. In a preferred application, the wafer 10 is an SOI wafer. However, any multilayer semiconductor material wafer with an edge could be used. Thus, it should be understood that SOI type wafers constitute only one of the possible applications of the invention, and such wafers are used herein merely by way of illustration. The invention is applicable to any type of multilayer wafer with an edge that is made of semiconductor materials. In particular, the present method applies to a wafer of silicon germanium on insulator (SGOI) or a wafer having a fine layer of SiGe on a supporting substrate (which substrate may be made of any kind of semiconductor material, for example, of Si). Wafers of this category are generally associated with the same thermal stresses at the edge as are SOI wafers, which are used by way of example in the text below. In this respect, it should be understood that the description below with reference to an SOI wafer is, in particular, directly transferable to wafers of the above-mentioned categories. The wafer may also be a multilayer wafer of the SOQ type (silicon on quartz).

In any event, the wafers to which the invention applies are multilayer wafers including an edge, for which the present method provides an advantageous solution concerning any differences in heat absorption by the edge.

Referring again to FIG. 2, the wafer 10 is heated by means of infrared lamps L which are positioned to face the wafer. A unit 200 serves to control the electrical power supplied to the lamps. As explained below, the unit 200 is suitable for controlling the supply of power to the various lamps selectively and individually so as to control the power emitted individually by each of the lamps. As a result, it is possible to individually control the power emitted by each lamp. For further description about this technique, reference can be made for example to International Application No. WO 01/69656 which illustrates annealing apparatus (for rapid thermal annealing) in which the various lamps are controlled individually.

FIG. 2 also illustrates a cross section of a thermal continuity structure 21 which surrounds the wafer 10, and which is spaced apart therefrom. The structure 21 is thus in the form of a closed ring which is placed concentrically about the wafer 10. This structure which is commonly referred to as an "edge ring" and serves to establish a certain amount of continuity in heat absorption beyond the edges of the wafer 10. In the absence of such a structure, interfering edge effects are observed at the periphery of the wafer. An example of such an edge ring is to be found in the International Application No. WO 01/69656 which has been mentioned above.

Some of the drawbacks which the present method seeks to solve originate in the peripheral edge region of the wafer (in particular to the generation of slip lines). However, the mere fact that a thermal continuity structure is provided that surrounds the wafer does not, by itself, solve the drawbacks mentioned above concerning slip lines that are generated when a multilayer semiconductor structure having an edge is thermally annealed. Conventionally, the function of edge rings has been limited to establishing a degree of thermal continuity in absorption beyond the borders of the wafer. For this purpose, edge rings in general have a "basic" cross-section that is rectangular in shape.

As explained below, in an embodiment of the present invention, improvements are proposed for such edge rings in order to perform a specific function of local and selective heating at the peripheral edge of the wafer, wherein the wafer has been placed at the center of the edge ring. In addition, the spacing between the edge ring and the wafer it surrounds has typically been chosen solely for the purpose of allowing the wafer to expand during thermal processing. In the present method, this spacing can be selectively adapted as a function of the thermal absorption coefficient at the edge of the wafer for the purpose of returning a greater or a smaller amount of heat to the wafer (more heat is returned when the spacing between the edge ring and the wafer is small than when the spacing is larger). When it is desired to increase heating at the edge of the wafer by using this local absorption coefficient, then the spacing is reduced. Conversely, if the absorption coefficient at the edge of the wafer requires decreased heating, then the spacing is increased.

In order to account for the peripheral edge of the wafer, the lamps L facing the edge ring are selectively powered to control the heat power they radiate based on the intrinsic heat absorption characteristics of the peripheral edge of the wafer. Thus, with an SOI wafer, the central region having an SOI multilayer structure presents a thermal absorption factor lying in the range 0.4 to 0.8, depending on the thickness of the SOI wafer. The peripheral edge represents a different thermal absorption factor, for example, this factor may be about 0.7 when the support is made of silicon. It will thus be understood that the central region and the edge region neither absorb nor reflect infrared heat radiation in the same manner. These differences give rise to localized temperature differences on the surfaces of these two regions, thus encouraging the appearance of slip lines. Thus, by controlling heating at the edge selectively and locally to take account of the differences in thermal absorption, the temperatures can be established that are substantially equivalent over the surface of both of these regions of the wafer, thereby preventing the appearance of slip lines.

In FIG. 2, the apparatus 20 may be filled with a gaseous mixture, for example a mixture of hydrogen and argon, or it could be filled with pure argon. The wafer is heated for the most part by the direct infrared radiation coming from the lamps L, however, a smaller part of its heating comes from thermal conduction via the gaseous mixture. This facilitates local control over the temperature of the wafer by selectively controlling the various lamps that face the wafer. In order to define the selective commands applied to the various lamps, the respective heat absorption coefficients of the central region and of the edge of the wafer are taken into account. These heat absorption coefficients are essentially determined on the basis of the nature of the materials that make up the layers of these two regions in the wafer, and is based on the respective thickness of the layers.

Figure 4:
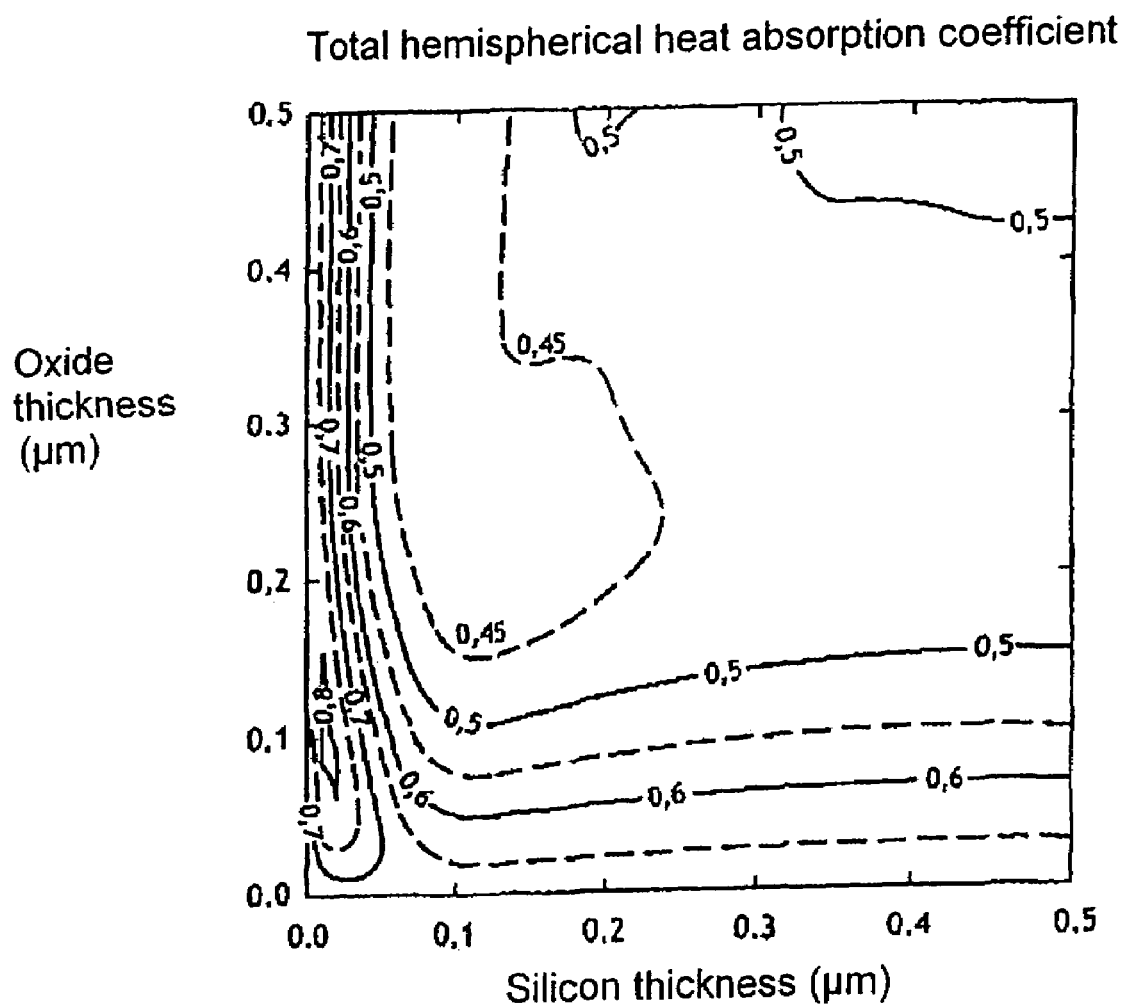
FIG. 4 is a chart which shows the values of the heat absorption factor of multilayer wafers as a function of respective thickness values of the layers of the wafer.

FIG. 4 is a chart taken from "Handbook of semiconductor manufacturing technology", page 224, (2000) by Timans et al., and it illustrates the simple case of a wafer comprising a layer of silicon on a layer of oxide on a silicon substrate. FIG. 4 shows that the heat absorption coefficient varies as a function of the relative thickness of these two layers. It is possible to establish equivalent charts for any type of multilayer wafer, as a function of the nature of the various layers.

For an SOI wafer which is a composite structure (i.e. built up as a stack of different layers), it is generally found that the central region corresponding to the SOI wafer absorbs less heat than does the peripheral edge of silicon. In such case it is appropriate to heat the central region of the wafer more than the edge, as compared with the heating that would be applied to a non-composite structure.

For a multilayer wafer with an edge made out of a semiconductor material, the power supply to the lamps of the apparatus is selected to heat the central region to a greater or lesser extent than the peripheral region as a function of the heat absorption coefficients of these two regions. In particular, if the edge has a heat absorption coefficient that is lower than that of the central region of the wafer, then heating is stronger or at a higher temperature at the edge than in the central region. If the converse situation applies, then the heating is stronger in the central region.

Determining the heat absorption coefficients of the layers of the multilayer wafer thus makes it possible to adapt the heating applied to the various regions of the multilayer wafer. It should be understood that this adaptation of the heating can be performed, as explained above, by selectively adapting the power fed to the various infrared lamps. However, heating can also be adapted and/or controlled by other means, either as an alternative or in combination with selectively applying power to the heater means, such as the lamps. Heat absorption coefficients can be determined in particular by using charts of the type shown in FIG. 4, which, for a multilayer wafer, plot the heat absorption coefficient as a function of the nature of the materials of the wafers and as a function of their thickness values. Thus, by selectively powering the infrared lamps, first means are made available for making the amount of heat actually absorbed by the various regions of the wafer more uniform. These first means correspond to a first implementation, which does not make use of a thermal continuity structure such as the edge ring described above. Thus, in this implementation, use of the thermal continuity structure is optional, and therefore it can be omitted.

However, as explained below, such a thermal continuity structure can be adapted and implemented astutely to comprise a second means for making the amount of heat actually absorbed by the various regions of the wafer more uniform. Such adaptation/implementation of the thermal continuity structure comprises a second implementation of the invention. It should be understood that this second implementation can be combined with the first implementation.

Returning to the thermal continuity structure 21 shown in FIG. 2, this structure can be placed around the wafer and at the same height as the wafer, as shown. But depending on the constraints associated with the annealing furnace, the thermal continuity structure may alternatively be placed around and below the wafer, to enable the wafer to be moved into its annealing position by following a horizontal path.

FIGS. 3a to 3c show three different thermal continuity structures. FIG. 3a shows a conventional configuration, which has a rectangular cross-section of constant thickness. The second embodiment could utilize such a thermal continuity structure by selectively adapting its dimensions to adapt temperature locally at the edge of the wafer, taking account of the local difference in heat absorption by the edge. If a thicker structure 21 is used (that is, the cross sections shown in FIGS. 3a to 3c are of greater width), then an increased temperature will be directed at the edge of the wafer. It is thus possible to vary the thickness of the thermal continuity structure as a function of the respective heat absorption coefficients of the central region and of the edge of the wafer. Returning to the case of SOI type wafer in which the edge presents a heat absorption coefficient greater than that of the central region, the thickness of the thermal continuity structure is smaller than it would be for annealing a wafer that does not have an edge.

It is also possible to selectively adapt the spacing "e" shown in FIG. 3a between the wafer and the thermal continuity structure 21. Increasing the space between the wafer and the thermal continuity structure contributes to reducing the temperature at the edge of the wafer. In the case of SOI wafer, the spacing "e" should be increased as compared to annealing a wafer that does not have an edge.

It is also possible to selectively adapt the shape of the thermal continuity structure to locally and selectively affect heating at the edge. FIGS. 3b and 3c thus show specific shapes for the cross-section of the structure 21. In FIG. 3b, the cross-section shows a top portion that is shaped to slope downwards towards the inside, which is towards the wafer. In FIG. 3c, the cross-section shows a rounded top, and this likewise includes a surface that slopes downwards to the inside. In particular, adopting a thermal continuity structure 21 whose cross-section presents a downward slope facing the wafer contributes to reducing the temperature at the edge of the wafer. This solution is thus well adapted to the above-mentioned case of an SOI wafer.

It should be understood that the above-mentioned implementations relating to the size of the structure 21, to the magnitude of the spacing "e", and to the shape of the structure 21 can be adopted alone or in combination with one another. Further, these implementations can also be taken in combination with selectively controlling the power supplied to the lamps L (combining both implementations of the invention as mentioned above).

In a third implementation of the invention, it is also possible to use charts of the kind shown in FIG. 4 for selecting a multilayer wafer having an edge and that presents substantially equivalent heat absorption coefficients in its central region and in its edge. This can be achieved by taking into consideration the nature of the materials comprising the layers of the wafer in these two regions, and the respective thickness values of these layers. In particular, if a wafer having layers made of given materials is to be processed, it is possible to adapt the thickness values of the layers to achieve substantially equivalent heat absorption coefficients in the central region and in the edge of the wafer.

In the third implementation, it is also possible to selectively add layers or layer portions in such a manner as to modify the heat absorption coefficient of the wafer (for the entire wafer, or locally). This can be done to obtain wafers having modified thermal characteristics. In particular, this makes it possible to increase the ranges of thickness values that are possible for the various layers of the wafer, for the purpose of obtaining a desired heat absorption coefficient for the wafer. Adding a layer having selected thermal characteristics can lead to greater tolerance in the thickness values that can be selected for other layers of the wafer, while still achieving a desired heat absorption coefficient for the wafer. Such an increase in the ranges of possible thickness values can be characterized for the wafer in question by plotting a chart similar to that of FIG. 4 (which corresponds to an SOI wafer).

This third implementation of the invention can also be combined with one or both of the first two implementations described above. Selecting thickness values for the layers of the wafer and/or inserting special layers can be implemented in combination with all of the above-mentioned implementations (such as selectively powering the lamps L, and adapting the characteristics of a thermal continuity structure 21), to therefore minimize the differences between the respective heat absorption coefficients of the central region and of the edge of the wafer.

What is claimed is:

1. A method for providing a multilayer semiconductor wafer having a central region and a peripheral edge each having a surface, such that during thermal treatment the appearance of slip lines on those surfaces is prevented and deformation of the wafer is minimized, the method comprising selecting thickness values for the layers of the wafer to provide substantially equivalent heat absorption coefficients both in the central region and the edge of the wafer, so that a substantially equivalent temperature is attained over the surface of the central region and the peripheral edge during thermal treatment, to thus prevent the appearance of slip lines on those surfaces while also preventing deformation of the wafer due to the thermal treatment.

2. The method of claim 1, which further comprises selectively adding layers or portions of layers upon the central region or peripheral edge of the wafer, or on both, to modify the heat absorption coefficient of the wafer.

3. The method of claim 1, wherein the thermal treatment comprises heat treating by utilizing a rapid thermal processing treatment.

4. The method of claim 3, wherein the rapid thermal processing treatment is a smoothing annealing treatment.

5. The method of claim 3, wherein the rapid thermal processing treatment is an oxidation annealing treatment.

6. The method of claim 1, wherein the wafer is a silicon-on-insulator wafer and wherein a reduced thermal treatment is conducted at the selected peripheral edge portions as compared to thermal treatment of a reference wafer that does not include an edge.

7. The method of claim 1, which further comprises selectively controlling a power supply to a plurality of infrared lamps that are directed towards the peripheral edge to thermally treat selected portions of the peripheral edge.

8. The method of claim 1, which further comprises placing the multilayer semiconductor wafer within a thermal continuity structure.

9. The method of claim 8, which further comprises selecting the dimensions of the thermal continuity structure to control the thermal treatment of the wafer.

10. The method of claim 8, wherein the wafer is a silicon-on-insulator wafer and wherein the thickness of the thermal continuity structure is less than the thickness of a thermal continuity structure that is used to thermally treat a reference wafer that does not include an edge.

11. The method of claim 8, wherein the spacing between the multilayer semiconductor wafer and the thermal continuity structure is selected to achieve a particular thermal treatment of the wafer.

12. The method of claim 11, wherein the wafer is a silicon-on-insulator wafer and wherein the space between the wafer and the thermal continuity structure is larger than the space between a thermal continuity structure and a reference wafer that does not include an edge.

13. The method of claim 8, which further comprises shaping the thermal continuity structure such that it is adapted to thermally treat selected portions of the wafer.

14. The method of claim 13, wherein the wafer is a silicon-on-insulator wafer and wherein the thermal continuity structure includes a downwardly facing border that is adapted to reflect heat towards the edge of the wafer.

* * * * *

UNITED STATES PATENT AND TRADEMARK OFFICE
CERTIFICATE OF CORRECTION

PATENT NO. : 7,049,250 B2  Page 1 of 1
APPLICATION NO. : 11/008928
DATED : May 23, 2006
INVENTOR(S) : Neyret et al.

It is certified that error appears in the above-identified patent and that said Letters Patent is hereby corrected as shown below:

Title Page,
Item [62] Related U.S. Application Data, after "Division of application No. 10/700,885, filed on Nov. 3, 2003" insert -- , now Pat. No. 6,853,802, Feb. 8, 2005 --.

Signed and Sealed this

Fifteenth Day of August, 2006

JON W. DUDAS
*Director of the United States Patent and Trademark Office*